(12) United States Patent
Ball et al.

(10) Patent No.: US 7,157,959 B2
(45) Date of Patent: Jan. 2, 2007

(54) METHOD OF FORMING A SELF-GATED TRANSISTOR AND STRUCTURE THEREFOR

(75) Inventors: Alan R. Ball, Gilbert, AZ (US); Paul J. Harriman, Goodyear, AZ (US); Stephen Meek, Phoenix, AZ (US); Suzanne Nee, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 339 days.

(21) Appl. No.: 10/813,501

(22) Filed: Mar. 31, 2004

(65) Prior Publication Data

US 2005/0218963 A1   Oct. 6, 2005

(51) Int. Cl.
*H03K 17/687* (2006.01)

(52) U.S. Cl. ........................ 327/427; 327/110

(58) Field of Classification Search ................ 327/108, 327/112, 427, 110, 434
See application file for complete search history.

(56) References Cited

U.S. PATENT DOCUMENTS

| 5,422,593 | A | * | 6/1995 | Fujihira | 327/561 |
| 5,796,278 | A | * | 8/1998 | Osborn et al. | 327/108 |
| 5,936,440 | A | * | 8/1999 | Asada et al. | 327/110 |
| 6,545,515 | B1 | * | 4/2003 | Takahashi et al. | 327/110 |
| 6,747,880 | B1 | | 6/2004 | Grover | 363/21.06 |
| 2003/0197532 | A1 | * | 10/2003 | Tsuchida | 327/108 |

OTHER PUBLICATIONS

Millman et al., Integrated Electronics: Analog and Digital Circuits and Systems, p. 568, fig. 16-33, 1972.*

* cited by examiner

*Primary Examiner*—Quan Tra
(74) *Attorney, Agent, or Firm*—Robert F. Hightower

(57) ABSTRACT

In one embodiment, a self-gated transistor includes a sensing portion that generates a sense signal that is used to drive the self-gated transistor.

20 Claims, 6 Drawing Sheets

METHOD OF FORMING A SELF-GATED TRANSISTOR AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to form synchronous rectifiers. One example of a synchronous rectifier was disclosed in U.S. Pat. No. 6,271,712 issued Alan Ball on Aug. 7, 2001, which is hereby incorporated herein by reference. As shown in the Alan Ball patent, the prior synchronous rectifier typically included a comparator that drove a power metal oxide semiconductor field effect transistor (MOSFET). One input of the comparator was coupled to the drain of the MOSFET in order to sense the source-to-drain voltage of the MOSFET, and to enable the MOSFET when the drain voltage was less than a source voltage value that would turn on a parasitic diode of the MOSFET. When enabled, the MOSFET discharged current from an inductor through the MOSFET. However, in order to turn-off the MOSFET, the source-to-drain voltage had to be greater than zero volts. This resulted in both the upper transistor and the synchronous rectifier being simultaneously enabled and increased the power dissipation of the synchronous rectifier. Additionally, because the comparator input was coupled to the drain of the MOSFET, the maximum voltage that could be applied to the drain was limited by the breakdown voltage of the input of the comparator.

Accordingly, it is desirable to have a device that turns off when the source-to-drain voltage is no greater than zero volts, and that has a high breakdown voltage.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 1:
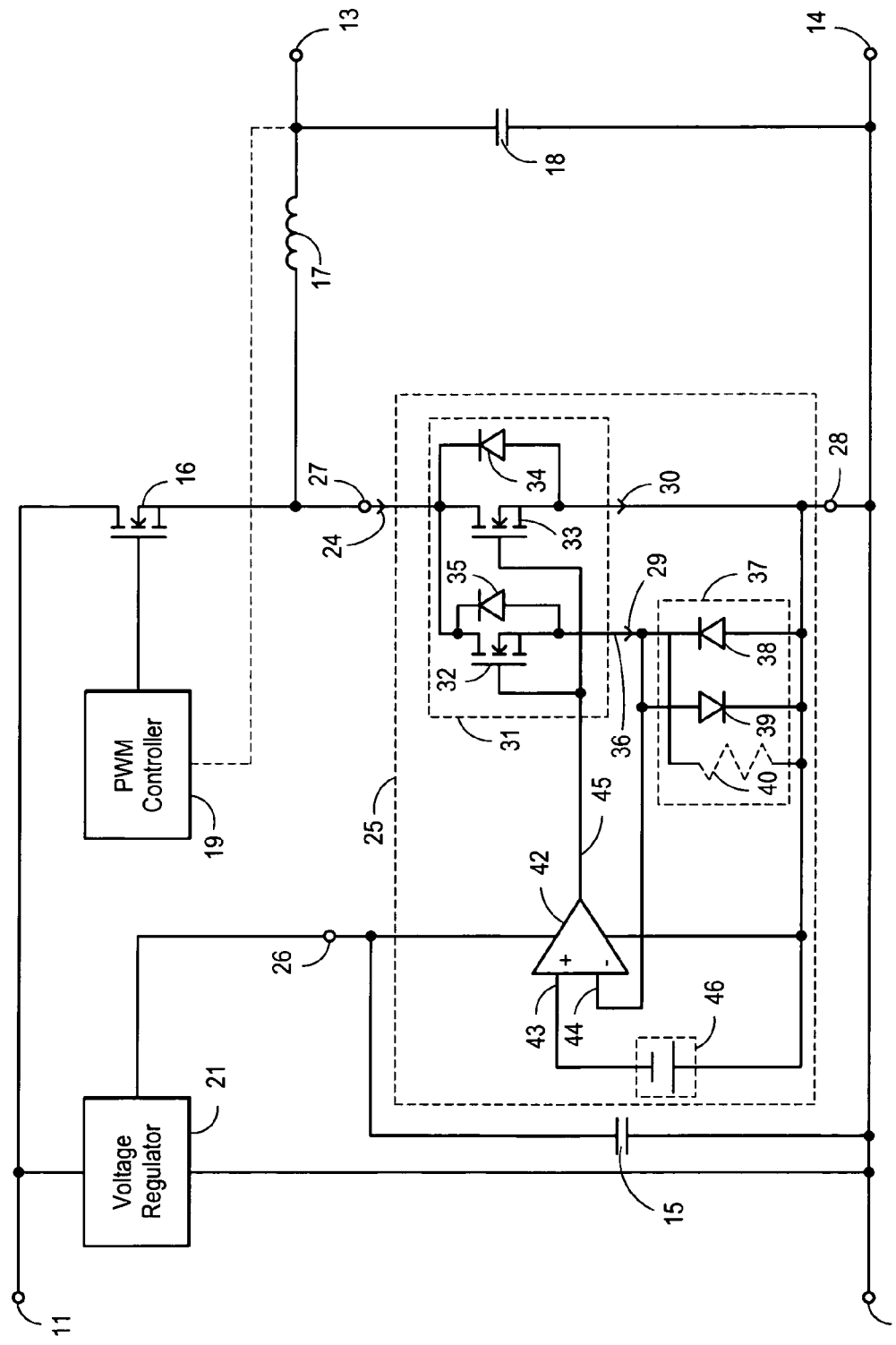
FIG. 1 schematically illustrates a portion of an embodiment of a self-gated transistor and a system utilizing the self-gated transistor in accordance with the present invention.

FIG. 1 schematically illustrates a portion of an embodiment of a self-gated transistor 25 that is connected as a synchronous rectifier in a power control system 10. Other components typically are connected externally to transistor 25 in order to provide functionality for system 10. For example, an upper output transistor 16, an energy storage inductor 17, an energy storage capacitor 18, a pulse width modulated (PWM) controller 19, and a voltage regulator 21 typically are connected externally to transistor 25. Although in some embodiments, regulator 21 may be formed as a portion of transistor 25. Inductor 17, capacitor 18, transistor 16, and controller 19 are illustrated to assist in the explanation of the operation of transistor 25. System 10 receives a bulk voltage between a bulk voltage input 11 and a bulk voltage return 12, and forms an output voltage between a voltage output 13 and a return 14. The bulk voltage applied between input 11 and return 12 may be as large as several hundred volts or as small as a couple of volts. Regulator 21 receives the bulk voltage and generates an operating voltage that is received on a voltage input 26 of transistor 25 for operating circuits internal to transistor 25. The output voltage of regulator 21 that is received on input 26 typically is a substantially dc voltage, however, the voltage may be a switched voltage. In order to supply a substantially constant dc voltage, regulator 21 may formed as a linear regulator or a non-linear regulator such as a PWM regulator. In either case, a capacitor 15 may have to be connected between input 26 and source 28 to provide energy storage. Capacitor 15 is required when using a non-linear regulator in order to supply an operating voltage during periods when no supply voltage is available. Typically, regulator 21 provides a substantially dc voltage that is received by transistor 25 on input 26. In the preferred embodiment, regulator 21 is a linear voltage regulator in order to provide the substantially dc voltage. Linear regulators are well known in the art and one example may be found in section two of "Power Supply Cookbook", Marty Brown, Section two, Butterworth-Heinemann, 1994. Regulator 21 generates sufficient voltage and current to power a comparator 42. Regulator 21 typically provides a voltage from about five to ten volts (5–10 V) and a current from about two to twenty milli-amps (2–20 ma). Controller 19 operates transistor 16 to regulate the value of the output voltage between output 13 and return 14. Typically, controller 19 receives a feedback voltage that represents the value of the output voltage as illustrated by a dashed line. One example of such a PWM controller is disclosed in U.S. Pat. No. 6,465,993 issued to Clarkin et al on Oct. 15, 2002, which is hereby incorporated herein by reference.

Self-gated transistor 25 is formed to include comparator 42, a transistor 31, an optional offset voltage or offset 46, and an optional protection circuit 37. Transistor 31 is formed to include a main transistor portion or main transistor 33 and a sensing portion or sense transistor 32. Transistor 31 also includes a diode 34 that is formed by the parasitic body diode of transistor 33, and a diode 35 that is formed by the parasitic body diode of transistor 32. Typically, transistor 31 is formed of many transistor cells that are interconnected to form a larger transistor that can have a large load current with a low on-resistance. A few of the cells have their sources separated from the sources of the remaining cells and are brought to a separate external terminal in order to form transistor 32. The drains of transistors 32 and 33 and the gates of transistors 32 and 33 generally are common. When a load current 24 flows through transistor 25, a main current 30 flows through transistor 33. Current 24 induces a sense current 29 to flow through transistor 32 to provide a sense signal that is representative of current 24. The value of current 29 is determined by the ratio of the size of transistor 32 to the size of transistor 33. Typically, the ratio is between five hundred and one thousand to one (500–1000:1). Such transistors are well known in the art and are often referred to as SENSEFET transistors. SENSEFET is a trademark of Motorola, Inc. of Schaumburg, Ill. One example of a SENSEFET transistor is disclosed in U.S. Pat. No. 4,553,084 issued to Robert Wrathall on Nov. 12, 1985, which is hereby incorporated herein by reference. As will be seen further hereinafter, transistor 25 is enabled or disabled based on the polarity of current 24 through transistor 25. Comparator 42 detects the polarity and responsively enables and disables transistor 31, thus, transistor 25.

A drain of transistor 31 is connected to a first terminal or drain 27 of transistor 25 and a source of transistor 31 is connected to a second terminal or source 28 of transistor 25. A source 36 of transistor 31 is connected to an inverting input 44 of comparator 42. A non-inverting input 43 of comparator 42 is connected to source 28, thus, to the source of transistor 31. Optional offset 46 represents an optional negative offset voltage that may be formed either externally to comparator 42 or formed as an internal offset in non-inverting input 43. Alternately, a positive offset may be formed for the inverting input of comparator 42. When offset 46 is included externally to input 43 of comparator 42, offset 46 has a positive terminal connected to source 28 and a negative terminal connected to non-inverting input 43. Offset 46 may be omitted in some embodiments. Optional protection circuit 37 may be used to clamp the voltage applied to source 36 and to input 44 to prevent damaging comparator 42 or transistor 32. Circuit 37 generally includes a first protection diode 38 and a second protection diode 39 that are connected in opposite polarity. The anode of diode 38 and the cathode of diode 39 are commonly connected to source 28, and the anode of diode 39 and the cathode of diode 38 are connected to source 36. In some embodiments, diodes 38 and 39 may be replaced by a resistor 40.

In the preferred embodiment, offset 46 is formed as an internal offset within input 43 of comparator 42. The value of the offset voltage typically varies from about zero to ten milli-volts (0–10 mV) and preferably is about five (5) milli-volts. Preferably, circuit 37 is used and includes diodes 38 and 39 in order to protect transistor 25. When transistor 16 is enabled, drain 27 is pulled to a voltage substantially equal to the bulk voltage on input 11. The high voltage on drain 27 is received by the drain of transistor 31 which responsively reverse biases diodes 34 and 35 to a non-conducting state. If this is an initial startup of system 10, transients may have somehow enabled transistor 31 and main current 30 will flow through transistor 33 to source 28 and return 12. Current 30 induces sense current 29 to flow through transistor 32. Comparator 42 receives current 29 as a sense signal and responsively drives output 45 low. Since comparator 42 has a high input impedance, a small amount of current 29 is sufficient to form a positive voltage that will force output 45 low. Such a voltage generally is not sufficient to forward bias diode 39. Transistor 31 receives the low on output 45 and responsively disables transistors 32 and 33 to disable transistor 31 and transistor 25. Transistor 16 remains enabled and current flows through transistor 16 and inductor 17 to charge capacitor 18. Thus, comparator 42 detects the positive flow of current 30 and responsively disables transistor 25.

When transistor 16 turns off, drain 27 is forced to a voltage that is less than the voltage of return 12, thus, less than the voltage on source 28. As the voltage on drain 27 goes below the forward voltage drop of diodes 34 and 35, diodes 34 and 35 are responsively forward biased and current begins to flow from return 12 through source 28 and through diode 34 to drain 27. The negative voltage on drain 27 also forward biases diode 38 and current flows from source 28 through diodes 38 and 35 to drain 27. Some of the current is received by input 44 as a sense signal. The current of the sense signal forms a voltage at input 44 that is more negative than the voltage on input 43 and output 45 is forced high. Due to the high input impedance, a small amount of current is sufficient to form a voltage at input 44. The high on output 45 enables transistors 32 and 33, and transistor 25 responsively turns-on and discharges the energy stored in inductor 17 through transistor 31 to return 12. Thus, comparator 42 detects the negative flow of current 30 and responsively enables transistor 25. Transistor 31 has a low on-resistance so the voltage drop across transistor 33 is less than the forward voltage drop of diode 34. The low drop across transistor 31 disables diodes 34 and 35 and reduces the voltage drop across transistor 25 between source 28 and drain 27 thereby reducing power dissipation in transistor 25.

When transistor 16 once again turns-on to begin charging inductor 17, drain 27 is pulled toward the bulk voltage on input 11. Since transistor 31 is enabled, as transistor 16 begins pulling drain 27 high, current 30 begins flowing through transistor 31 to source 28. The turn-on of transistor 16 occurs over a period of time determined by the gate drive from controller 19 as is well known in the art. As current 30 begins flowing in the reverse direction through transistor 33, sense current 29 is reversed in direction and flows through transistor 32 to form a positive sense signal for transistor 25. A small amount of current 29 is sufficient to form a voltage at input 44. Because the negative voltage of offset 46 ensures that input 43 is negative relative to source 28, a small amount of current 29 is sufficient to form a voltage on input 44 that is greater than input 43. The positive voltage received on input 44 forms a sense signal that forces output 45 low. The low on output 45 disables transistors 32 and 33 thereby disabling transistor 31 and transistor 25. Thus, comparator 42 detects the positive flow of current 30 and responsively disables transistor 25. Because of offset 46, comparator 42 begins disabling transistor 25 before the current from transistor 16 is able to force current 30 to transition from flowing from source 28, or negatively, to flowing into source 28, or positively. Applying the low signal to begin the process of disabling transistor 25 typically occurs before current 30 reaches zero due to the negative voltage of offset 46. The point at which transistor 25 is completely disabled will occur after the current reaches zero and is based on the negative voltage of offset 46 and the di/dt of the current waveform. Applying the low signal to begin disabling transistor 25 prior to the zero crossing minimizes the amount of current flowing from transistor 16 through transistor 25 to return 12 thereby minimizing power dissipation. Disabling transistor 25 prior to the zero crossing also minimizes oscillations on output 13 as the current is making the transition. It can be seen that transistor 25 can be manufactured in a three lead package having leads for input 26, drain 27, and source 28.

In an alternate embodiment that excludes diodes 38 and 39, the operation is the same. However, there is a potential for spikes to occur at input 44 during switching transitions due to high di/dt's and parasitic inductances. Without any clamping from diodes 38 and 39, input 44 and source 36 are not protected from such voltage transients. Without any clamping from diodes 38 and 39, current will be forced into or out of input 44 and force it to switch. The voltage seen at input 44 will be the maximum voltage that can be produced by transistor 32. When transistor 32 is enabled, the voltage is very small and when transistor 32 is disabled, the voltage may be several volts. In another alternate embodiment that uses resistor 40 instead of diodes 38 and 39, a portion of current 29 flows through resistor 40 and forms the positive voltage that is received by input 44.

Figure 2:
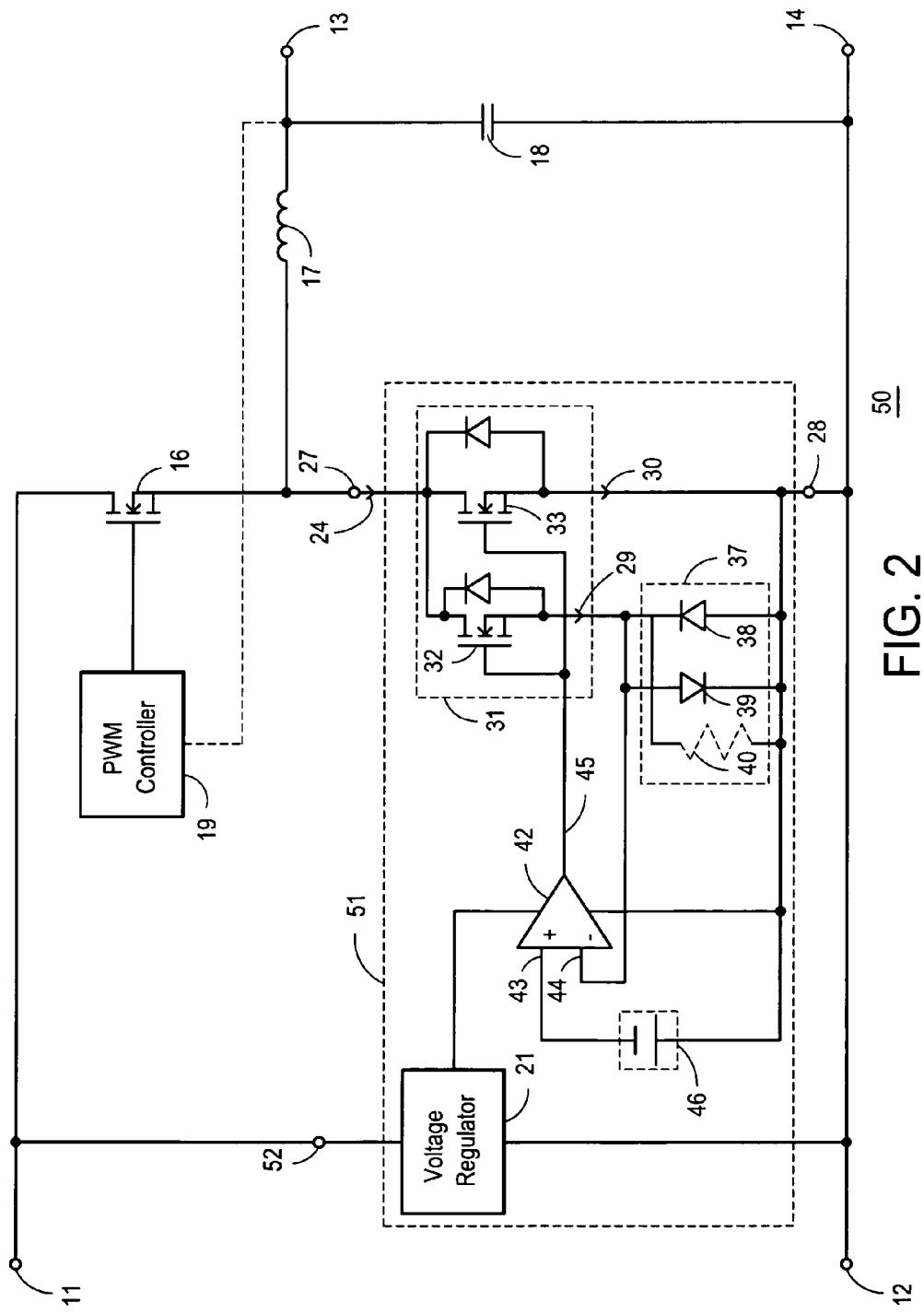
FIG. 2 schematically illustrates a portion of an alternate embodiment of a self-gated transistor and another system in accordance with the present invention.

FIG. 2 schematically illustrates a portion of an embodiment of a self-gated transistor 51 that is an alternate embodiment of transistor 25 explained in the description of FIG. 1. Transistor 51 is connected as a synchronous rectifier in a power control system 50 that is an alternate embodiment of system 10 explained in the description of FIG. 1. Transistor 51 is formed to include voltage regulator 21 in addition to transistor 25. Regulator 21 preferably generates a substantially dc voltage that is used for operating transistor 25. Regulator 21 receives a voltage on a voltage input 52. The voltage applied to input 52 may be a switched voltage or a substantially dc voltage as long as the voltage value is greater than the voltage supplied by the output of regulator 21.

Figure 3:
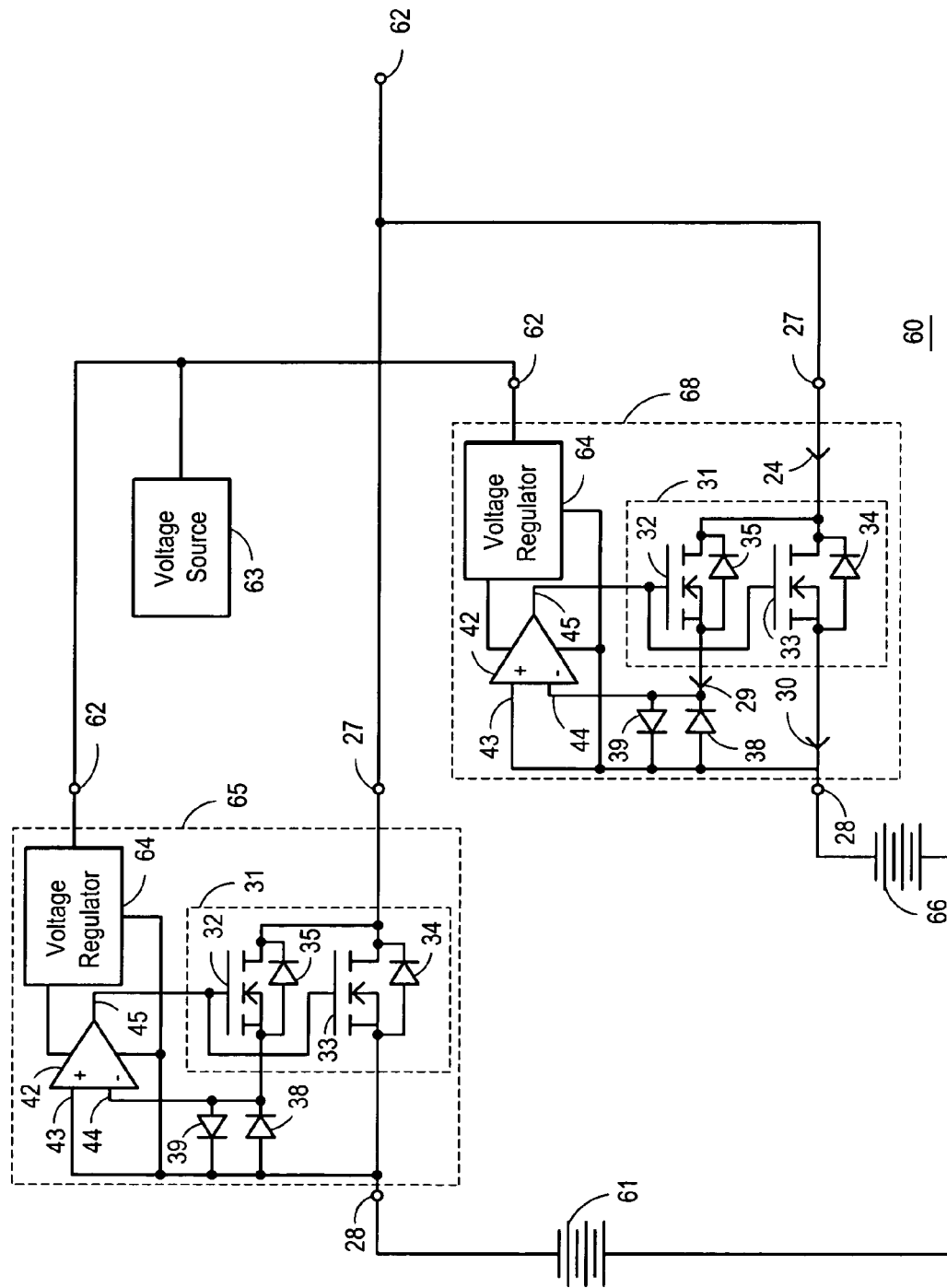
FIG. 3 schematically illustrates a portion of another embodiment of a system utilizing a self-gated transistor in accordance with the present invention.

FIG. 3 schematically illustrates a portion of an embodiment of two self-gated transistors 65 connected to function as a replacement for a pair of ORing diodes in a power control system 60. Transistors 65 are an alternate embodiment of transistor 51 explained in the description of FIG. 2. System 60 includes a pair of separate voltage sources 61 and 66, two self-gated transistors 65 and 69, an operation voltage source 63, and an output 62. Source 63 provides a voltage to transistors 65 and 68 for operating transistors 65 and 68. The voltage of source 63 may be derived from sources 61 or 66 or from elsewhere. Transistors 65 and 68 each include a voltage regulator 64 that provides a substantially dc voltage internally to transistors 65 and 68 for operating transistors 65 and 68. In the preferred embodiment, regulator 64 is a linear regulator. In some embodiments, regulator 64 may be external to transistors 65 and 68. Voltage sources 61 and 66 generally are connected in parallel to provide redundant power sources in the event that one of sources 61 or 66 fail. A load typically is connected between output 62 and the returns or grounds of voltage sources 61 and 66 to receive the output voltage and a load current.

Voltage source 61 is connected to source 28 of transistor 65 and source 66 is connected to source 28 of transistor 68 to supply voltages thereto. When voltage sources 61 and 66 are turned-on, the load on output 62 pulls output 62 and drains 27 low below the voltage of source 28. This causes one of sources 61 or 66 to supply current through diodes 34 and through diodes 38 and 35 to output 62 and the load. Typically, processing variations cause transistors 65 and 68 to have different forward voltage drops across respective diodes 34. Consequently, the one with the smallest voltage drop is the first one enabled to conduct current and to subsequently enable transistor 31. The other transistor of transistors 65 and 68 typically will not be enabled. The current through the relevant diode 38 forms a voltage drop across diode 38 and a corresponding sense signal as a positive voltage from input 43 to input 44 of comparator 42. Inputs 44 and 43 receive the positive voltage and comparator 42 responsively forces output 45 high to enable transistor 31 and short out diodes 34 and 35. The low on-resistance of transistor 31 reduces the voltage drop between source 28 and drain 27 thereby reducing the power dissipation of transistor 65.

If a fault or other failure of the enabled transistor of transistors 65 and 68 allows drains 27 to go low again, the other transistor of transistors 65 and 68 enables the respective diodes 34 and 38 and 35, and subsequently enables the corresponding transistor 31.

Figure 4:
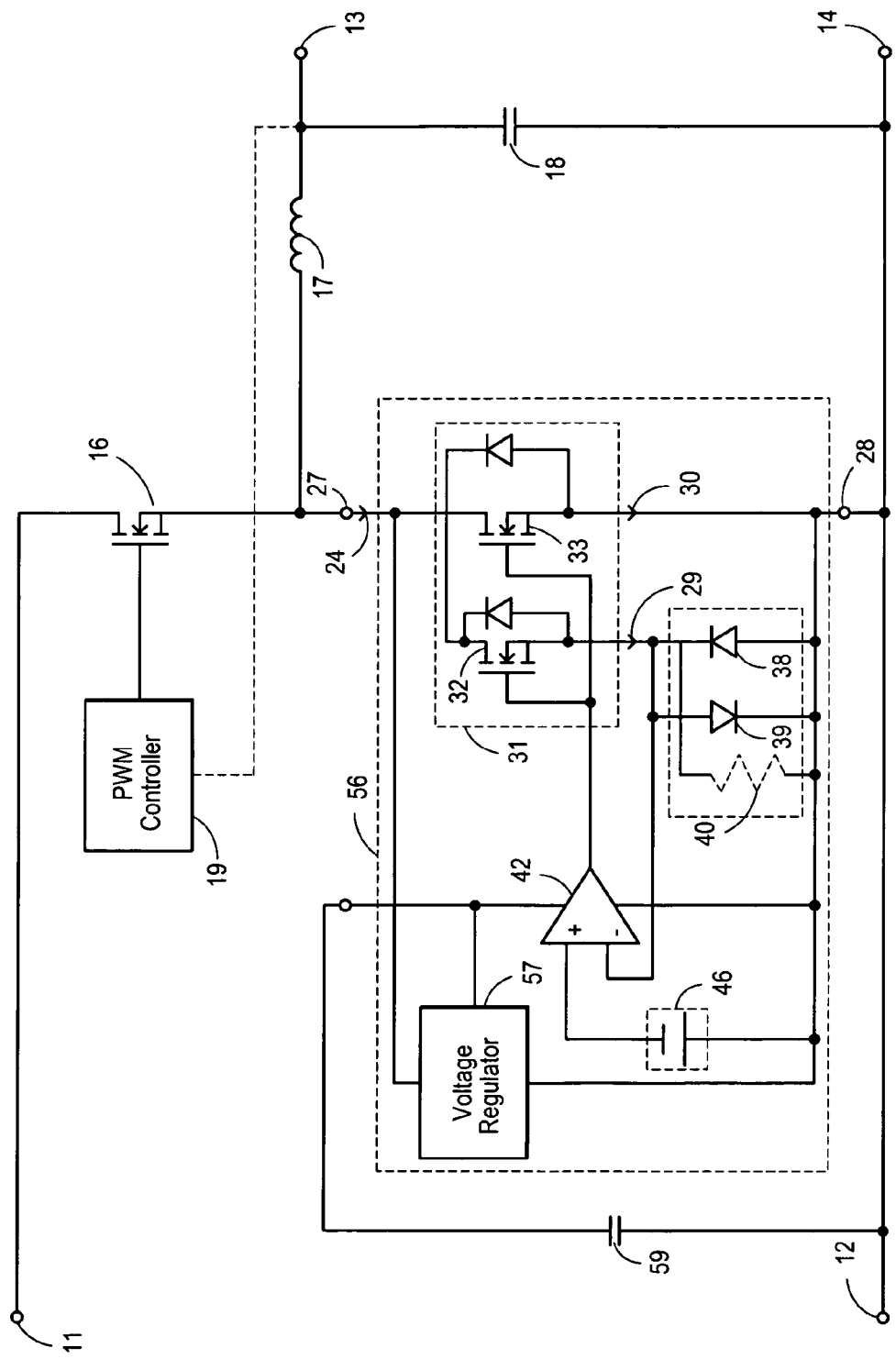
FIG. 4 schematically illustrates a portion of another alternate embodiment of a self-gated transistor and another system in accordance with the present invention.

FIG. 4 schematically illustrates a portion of an embodiment of a self-gated transistor 56 that is an alternate embodiment of transistor 51 explained in the description of FIG. 2. Transistor 56 is connected as a synchronous rectifier in a power control system 55 that is an alternate embodiment of system 50 explained in the description of FIG. 2. Transistor 56 is formed to include a voltage regulator 57 that receives an input voltage from drain 27. Regulator 57 uses the voltage on drain 27 to charge a capacitor 59 as required to form a voltage that is used for operating transistor 25. Regulator 57 typically is formed as a bias supply circuit. Such regulators are well known to those skilled in the art.

Figure 5:
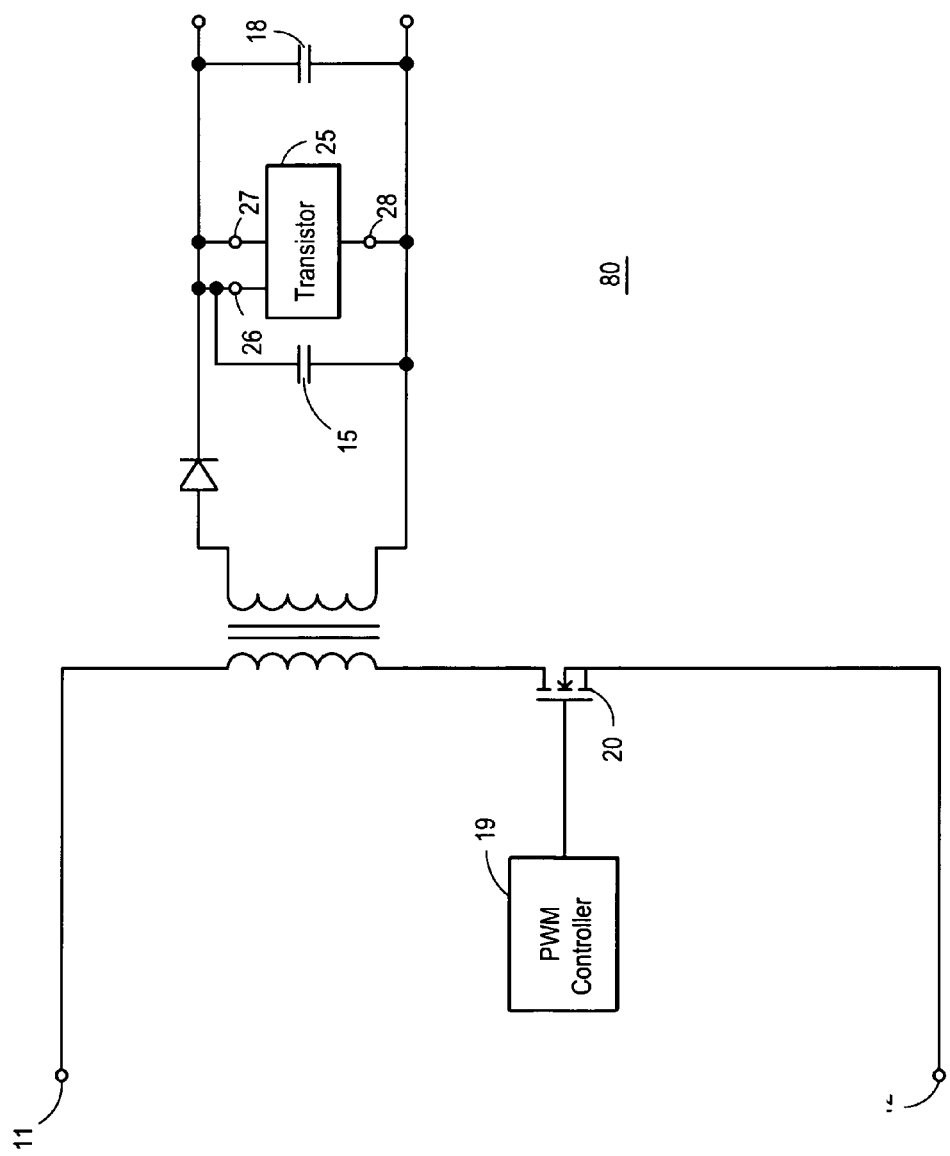
FIG. 5 schematically illustrates a portion of another alternate embodiment of a system that utilizes a self-gated transistor in accordance with the present invention.

FIG. 5 schematically illustrates a portion of an embodiment of a power supply system 80 that utilizes transistor 25 as a synchronous rectifier. System 80 is an alternate embodiment of system 10 illustrated in FIG. 1.

Figure 6:
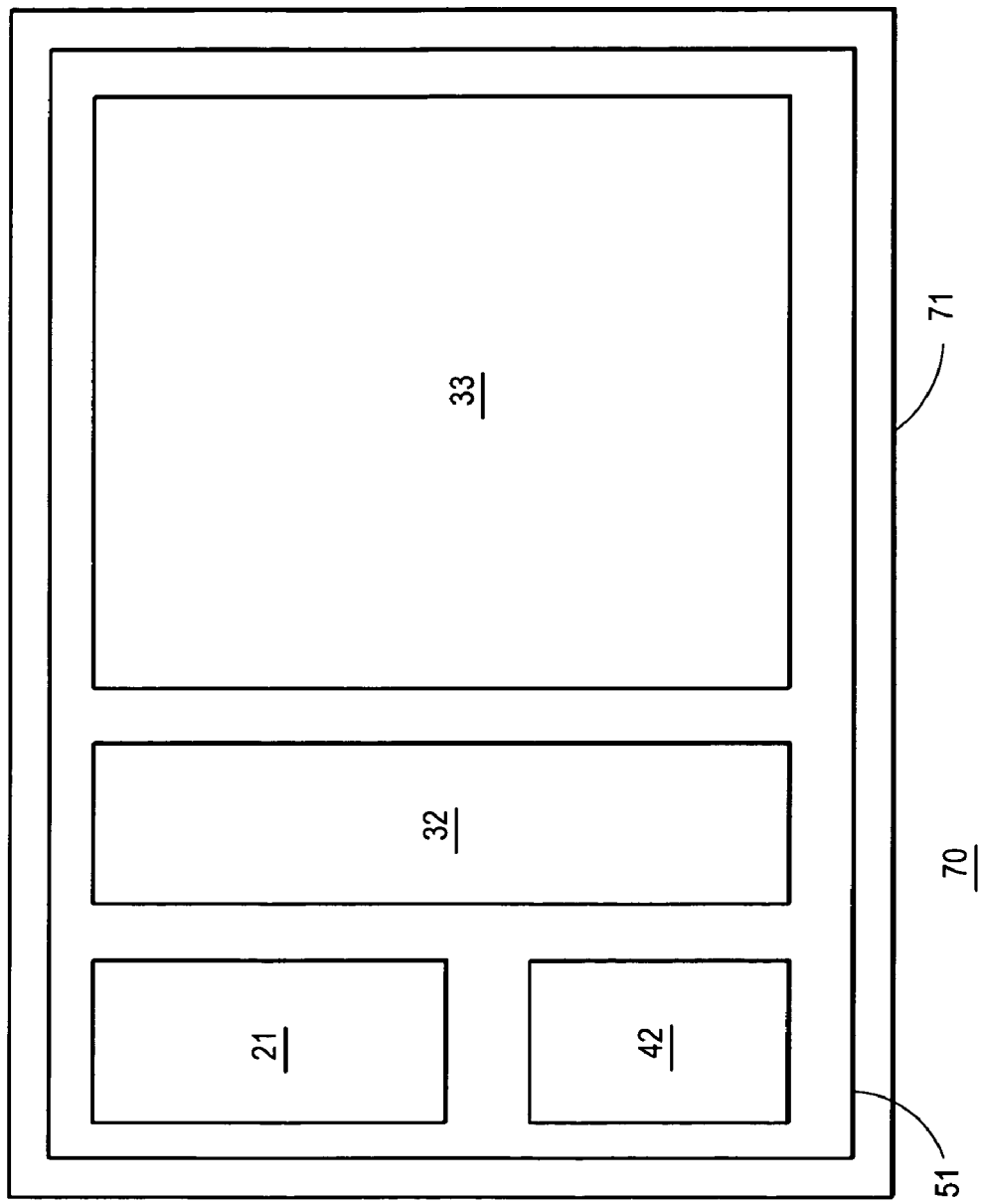
FIG. 6 schematically illustrates an enlarged plan view of a semiconductor device incorporating a self-gated transistor in accordance with the present invention.

FIG. 6 schematically illustrates an enlarged plan view of a portion of an embodiment of a semiconductor device 70 that is formed on a semiconductor die 71. Transistor 25 or alternately transistor 51 or 56 or 65 is formed on die 71. Die 71 may also include other circuits that are not shown in FIG. 4 for simplicity of the drawing. Transistors 25 or 51 or 56 or 65 and device 70 are formed on die 71 by semiconductor manufacturing techniques that are well know to those skilled in the art.

In view of all of the above, it is evident that a novel device and method is disclosed. Included, among other features, is using a transistor having a sensing portion to provide a sense signal for enabling the transistor. Using a sensing transistor portion to provide the sense signal facilitates using the self-gated transistor in high voltage applications. Using a negative comparator offset facilitates disabling the self-gated transistor before the current through transistors switches polarity thereby minimizing power dissipation and reducing oscillation in the output.

While the invention is described with specific preferred embodiments, it is evident that many alternatives and variations will be apparent to those skilled in the semiconductor arts. For example, transistor 32 may be replaced with a power FET in series with a resistor wherein the sense signal is produced across the resistor.

The invention claimed is:

1. A method of forming a self-gated transistor comprising:
   coupling a transistor operable to form a sense signal representative of a current through the self-gated transistor; and
   configuring a first circuit of the self-gated transistor to disable the transistor substantially upon a positive current flow through the transistor and to enable the transistor responsively to a negative current flow through the transistor.

2. The method of claim 1 wherein coupling the transistor operable to form the sense signal representative of the current through the self-gated transistor includes forming the transistor having a main transistor portion and a sense transistor as a sensing portion including coupling the main transistor portion to the sensing portion wherein the sensing portion is operable to form the sense signal representative of the current through the self-gated transistor.

3. The method of claim 2 wherein coupling the main transistor portion to the sensing portion includes coupling a drain of the sense transistor to a drain of the main transistor portion and to the drain of the self-gated transistor and also including coupling a gate of the sense transistor to a gate of the main transistor portion and to the gate of the self-gated transistor.

4. The method of claim 1. wherein configuring the first circuit of the self-gated transistor to disable the transistor substantially upon the positive current flow through the transistor and to enable the transistor responsively to the negative current flow through the transistor includes coupling a comparator to receive the sense signal wherein the sense signal is positive for the positive current flow and is negative for the negative current flow.

5. The method of claim 4 wherein coupling the comparator to receive the sense signal includes coupling a non-inverting input of the comparator to have a negative offset voltage.

6. The method of claim 4 wherein coupling the comparator to receive the sense signal includes coupling the comparator to responsively enable the self-gated transistor when the sense signal forms a voltage that is less than a voltage of a source of the self-gated transistor.

7. The method of claim 4 wherein coupling the comparator to receive the sense signal includes coupling one of a diode or a resistor between a source of a sense transistor and a source of the self-gated transistor.

8. A method of operating a self-gated transistor comprising:
providing an MOS transistor having a main transistor portion and a sensing portion including coupling the main transistor portion to the sensing portion wherein the sensing portion is operable to form a first sense signal representative of a first current through the main transistor portion;
configuring the self-gate transistor to detect the first sense signal and responsively disable the self-gated transistor;
configuring the self-gate transistor to conduct a second current through the sensing portion as a second sense signal wherein the second current flows in a direction opposite to the first current; and
configuring the self-gate transistor to detect the second sense signal and responsively enable the self-gated transistor.

9. The method of claim 8 wherein configuring the self-gate transistor to conduct the second current through the sensing portion as the second sense signal includes configuring the self-gate transistor to steer the second current to flow through a diode.

10. The method of claim 8 wherein configuring the self-gate transistor to conduct the second current through the sensing portion as the second sense signal includes configuring the self-gate transistor to steer the second sense current to flow through a resistor.

11. The method of claim 8 wherein configuring the self-gate transistor to detect the first sense signal and responsively disable the self-gated transistor includes coupling an input of a comparator to receive the first sense signal.

12. A self-gated transistor comprising:
a transistor having a main transistor portion and a sensing portion wherein the sensing portion is coupled to the main transistor portion to form a sense signal representative of a current through the self-gated transistor, the main transistor portion having a first gate; and
a control circuit coupled to receive the sense signal and drive the first gate to enable the transistor responsively to a first polarity of the sense signal and to disable the transistor responsively to an opposite polarity of the sense signal.

13. The self-gated transistor of claim 12 wherein the control circuit includes a comparator having an inverting input coupled to receive the sense signal.

14. The self-gated transistor of claim 13 wherein the comparator has a non-inverting input coupled to a source of the self-gated transistor.

15. The self-gated transistor of claim 14 wherein the non-inverting input of the comparator has a negative offset voltage.

16. The self-gated transistor of claim 12 further including the sensing portion having a source that is separate from a source of the main transistor portion and a protection circuit coupled to the source of the sensing portion.

17. The self-gated transistor of claim 12 wherein a source of the main transistor portion is coupled to a source of the self-gated transistor.

18. The self-gated transistor of claim 12 further including a voltage regulator coupled to provide an operating voltage to the comparator and coupled to a source of the self-gated transistor.

19. The self-gated transistor of claim 12 further including the self-gated transistor formed in a package having no greater than four leads.

20. The method of claim 1 further including configuring an internal voltage regulator of the self-gated transistor to receive an external voltage having a first value from a voltage source external to the self-gated transistor and regulating the external voltage to form an internal operating voltage having a second value that is less than the first value including configuring the self-gated transistor to use the internal operating voltage to operate the first circuit.

* * * * *